(12) United States Patent
Kim et al.

(10) Patent No.: US 10,991,899 B2
(45) Date of Patent: Apr. 27, 2021

(54) QUANTUM DOT DEVICE AND ELECTRONIC DEVICE

(71) Applicant: SAMSUNG ELECTRONICS CO., LTD., Suwon-si (KR)

(72) Inventors: Sung Woo Kim, Hwaseong-si (KR); Kun Su Park, Seongnam-si (KR); Dae Young Chung, Suwon-si (KR); Eun Joo Jang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/561,474

(22) Filed: Sep. 5, 2019

(65) Prior Publication Data

US 2020/0227663 A1 Jul. 16, 2020

(30) Foreign Application Priority Data

Jan. 15, 2019 (KR) .................. 10-2019-0005324

(51) Int. Cl.
- *H01L 51/50* (2006.01)
- *H01L 51/00* (2006.01)
- *H01L 51/56* (2006.01)

(52) U.S. Cl.
CPC ........ *H01L 51/502* (2013.01); *H01L 51/0003* (2013.01); *H01L 51/5004* (2013.01);
(Continued)

(58) Field of Classification Search
None
See application file for complete search history.

(56) References Cited

U.S. PATENT DOCUMENTS 9,768,404 B1 9/2017 Steckel et al.
2008/0297044 A1* 12/2008 Jun .................. C01G 11/02
313/504

(Continued)

FOREIGN PATENT DOCUMENTS

CN 102633437 A 8/2012
CN 107910449 A 4/2018
(Continued)

OTHER PUBLICATIONS

Extended European Search Report dated Mar. 30, 2020, of the corresponding European Patent Application No. 19194920.5.
(Continued)

*Primary Examiner* — Evren Seven
(74) *Attorney, Agent, or Firm* — Cantor Colburn LLP

(57) ABSTRACT

A quantum dot device including an anode and a cathode facing each other; a quantum dot layer between the anode and the cathode; a hole transport layer between the anode and the quantum dot layer, the hole transport layer being configured to increase a hole transporting property from the anode to the quantum dot layer; an inorganic electron transport layer between the cathode and the quantum dot layer, the inorganic electron transport layer being configured to increase an electron transporting property from the cathode to the quantum dot layer; and an inorganic electron controlling layer between the cathode and the quantum dot layer, the inorganic electron controlling layer being configured to decrease an electron transporting property from the cathode to the quantum dot layer, and an electronic device including the same.

20 Claims, 7 Drawing Sheets

(52) U.S. Cl.
CPC ........ *H01L 51/508* (2013.01); *H01L 51/5056* (2013.01); *H01L 51/56* (2013.01); *H01L 2251/303* (2013.01); *H01L 2251/5369* (2013.01); *H01L 2251/552* (2013.01); *H01L 2251/558* (2013.01)

(56) References Cited

U.S. PATENT DOCUMENTS

| | | | |
|---|---|---|---|
| 2017/0186909 A1* | 6/2017 | Kim | H01L 51/5004 |
| 2017/0221969 A1* | 8/2017 | Steckel | H01L 27/3211 |
| 2017/0271605 A1 | 9/2017 | Steckel et al. | |
| 2017/0373263 A1* | 12/2017 | Stubbs | H01L 51/5072 |
| 2017/0373266 A1 | 12/2017 | Xu et al. | |
| 2018/0019371 A1 | 1/2018 | Steckel et al. | |
| 2018/0205030 A1* | 7/2018 | Meng | H01L 51/508 |
| 2019/0097139 A1* | 3/2019 | Lee | H01L 51/5206 |
| 2019/0189928 A1* | 6/2019 | Chung | H01L 51/5096 |
| 2019/0296257 A1* | 9/2019 | Palles-Dimmock | H01L 51/5056 |

FOREIGN PATENT DOCUMENTS

| | | |
|---|---|---|
| CN | 106654026 B | 12/2018 |
| CN | 109148704 A | 1/2019 |
| JP | 2014017440 A | 1/2014 |
| WO | 2017160410 A1 | 9/2017 |

OTHER PUBLICATIONS

Aqiang Wang et al., "Bright, efficient, and color-stable violet ZnSe-based quantum dot light-emitting diodes," Nanoscale, Jan. 5, 2015, pp. 2951-2959, vol. 7.

Xingliang Dai et al., "Solution-processed, high-performance light-emitting diodes based on quantum dots," Nature, Nov. 6, 2014, pp. 96-99, vol. 515.

Yuanda Liu et al., "Introducing $Ga_2O_3$ thin films as novel electron blocking layer to ZnO/p-GaN heterojunction LED," Applied Physics B, Sep. 23, 2012, pp. 605-609, vol. 109.

* cited by examiner

QUANTUM DOT DEVICE AND ELECTRONIC DEVICE

CROSS-REFERENCE TO RELATED APPLICATION

This application claims priority to and the benefit of Korean Patent Application No. 10-2019-0005324 filed in the Korean Intellectual Property Office on Jan. 15, 2019, and all the benefits accruing therefrom under 35 U.S.C. § 119, the entire content of which is incorporated herein by reference.

BACKGROUND

1. Field

A quantum dot device and an electronic device are disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, when semiconductor nanocrystal particles also known as quantum dots are supplied with photoenergy or electrical energy, the quantum dots may emit light in a wavelength corresponding to sizes of the quantum dots. Accordingly, the quantum dots may be used as a light emitting element emitting light of a particular wavelength.

SUMMARY

A quantum dot device may use quantum dots as a light emitting element. A method of improving performance of the quantum dot device is desired.

An embodiment may provide a quantum dot device capable of realizing improved performance.

An embodiment provides an electronic device including the quantum dot device.

According to an embodiment, a quantum dot device includes an anode and a cathode facing each other; a quantum dot layer between the anode and the cathode; a hole transport layer between the anode and the quantum dot layer, the hole transport layer being configured to increase a hole transporting property from the anode to the quantum dot layer; an inorganic electron transport layer between the cathode and the quantum dot layer, the inorganic electron transport layer being configured to increase an electron transporting property from the cathode to the quantum dot layer; and an inorganic electron controlling layer between the cathode and the quantum dot layer, the inorganic electron controlling layer being configured to decrease an electron transporting property from the cathode to the quantum dot layer.

The inorganic electron controlling layer may be disposed between the cathode and the inorganic electron transport layer, between the quantum dot layer and the inorganic electron transport layer, or a combination thereof.

The inorganic electron transport layer may include a first inorganic material and the inorganic electron controlling layer may include a second inorganic material that is different from the first inorganic material.

The first inorganic material may include a zinc-containing oxide.

The zinc-containing oxide may be represented by $Zn_{1-x}M_xO$, wherein M is Mg, Co, Ni, Zr, Mn, Sn, Y, Al, or a combination thereof, and $0 \le x < 0.5$.

The second inorganic material may include an oxide, a nitride, a sulfide, a phosphide, or a halide including gallium, nickel, copper, tungsten, manganese, chromium, tantalum, bismuth, indium, aluminum, lead, zirconium, or a combination thereof.

The second inorganic material may include $\gamma\text{-}Ga_2O_3$.

The first inorganic material may include a zinc-containing oxide represented by $Zn_{1-x}M_xO$, wherein M is Mg, Co, Ni, Zr, Mn, Sn, Y, Al, or a combination thereof and $0 \le x < 0.5$, and the second inorganic material may include a gallium oxide.

The first inorganic material and the second inorganic material may each include a nanoparticle having an average particle diameter of less than or equal to about 10 nanometers (nm).

A lowest unoccupied molecular orbital (LUMO) energy level of the inorganic electron controlling layer may be less than a LUMO energy level of the quantum dot layer and a LUMO energy level of the inorganic electron transport layer, respectively.

An energy bandgap of the inorganic electron controlling layer may be larger than an energy bandgap of the quantum dot layer and an energy bandgap of the inorganic electron transport layer.

A thickness of the inorganic electron controlling layer may be less than a thickness of the inorganic electron transport layer.

A thickness of the inorganic electron controlling layer may be about 1 nm to about 10 nm.

The quantum dot layer may include a non-cadmium quantum dot.

The non-cadmium quantum dot may include zinc (Zn) and tellurium (Te), selenium (Se), or a combination thereof, or indium (In) and zinc (Zn), phosphorus (P), or a combination thereof.

The quantum dot may include a core including zinc (Zn) and tellurium (Te), selenium (Se), or a combination thereof or indium (In) and zinc (Zn), phosphorus (P), or a combination thereof and a shell on at least one part of the core, the shell including a different composition from the core.

The shell may include ZnSeS, ZnS, or a combination thereof.

According to an embodiment, a method of manufacturing a quantum dot device includes forming an anode, forming a hole transport layer on the anode, forming a quantum dot layer on the hole transport layer, forming an inorganic electron transport layer on the quantum dot layer, forming an inorganic electron controlling layer on the quantum dot layer, and forming a cathode on inorganic electron transport layer and the inorganic electron controlling layer, wherein the forming of the inorganic electron controlling layer is performed before the forming of the inorganic electron transport layer, after the forming of the inorganic electron transport layer, or a combination thereof, and the forming of the quantum dot layer, the forming of the inorganic electron transport layer, and the forming of the inorganic electron controlling layer are each performed using a solution process.

The forming of the inorganic electron transport layer may include preparing a dispersion for the inorganic electron transport layer including an inorganic nanoparticle represented by $Zn_{1-x}M_xO$, wherein $0 \le x < 0.5$, using a solution including a Zn precursor and optionally an M precursor, wherein M is Mg, Co, Ni, Zr, Mn, Sn, Y, Al, or a combination thereof, through a sol-gel reaction and coating the dispersion for the inorganic electron transport layer, and the forming of the inorganic electron controlling layer may include heat-treating a solution including a Ga precursor to prepare a dispersion for the inorganic electron controlling layer including an inorganic nanoparticle represented by $\gamma$-$Ga_2O_3$, and coating the dispersion for the inorganic electron controlling layer.

According to an embodiment, an electronic device includes the quantum dot device.

Performance of the quantum dot device may be improved.

DETAILED DESCRIPTION

Figure 1:
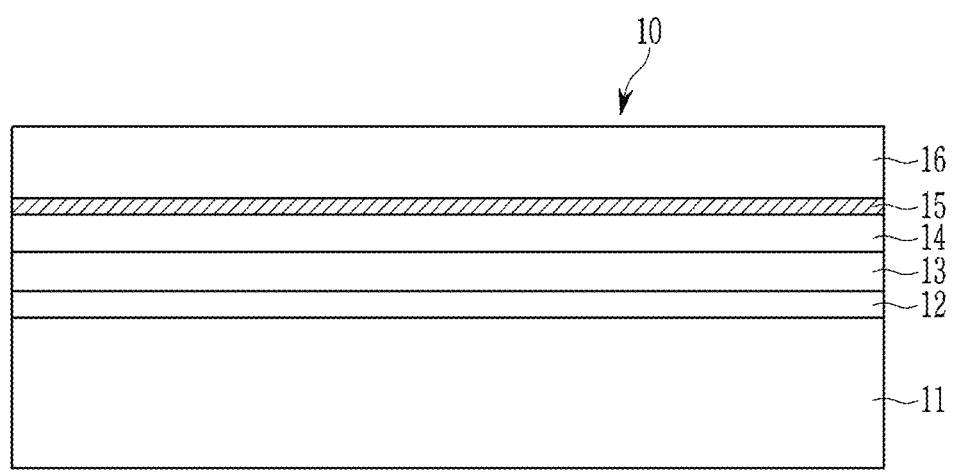
FIGS. 1 to 3 are schematic cross-sectional views showing quantum dot devices according to embodiments.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function, a highest occupied molecular orbital (HOMO) energy level, and a lowest unoccupied molecular orbital (LUMO) energy level are expressed as an absolute value from a vacuum level. In addition, when the work function, HOMO energy level, and LUMO energy level are referred to be "deep," "high" or "large," the work function, HOMO energy level, and LUMO energy level have a large absolute value from "0 electronvolts (eV)" of the vacuum level, while when the work function, HOMO energy level and LUMO energy level are referred to be "shallow," "low," or "small," the work function, HOMO energy level, and LUMO energy level have a small absolute value from "0 eV" of the vacuum level.

Hereinafter, a quantum dot device according to an embodiment is described with reference to drawings.

Figure 2:
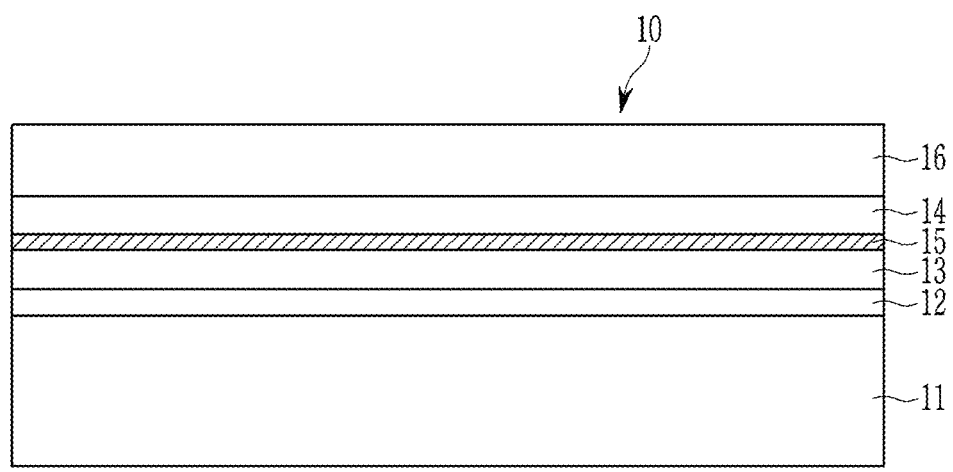
Figure 3:
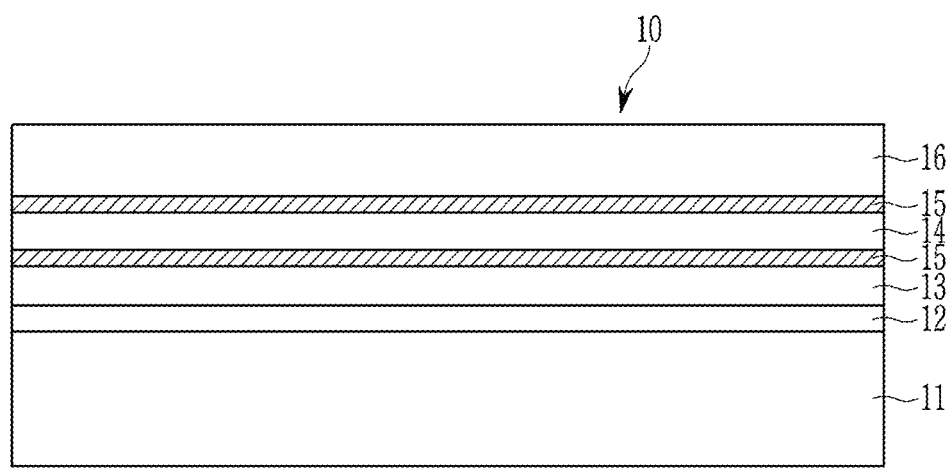

FIGS. 1 to 3 are schematic cross-sectional views of quantum dot devices according to embodiments.

Referring to FIGS. 1 to 3, a quantum dot device 10 according to an embodiment includes an anode 11 and a cathode 16; a quantum dot layer 13 disposed between the anode 11 and the cathode 16; a hole transport layer 12 disposed between the anode 11 and the quantum dot layer 13; and an electron transport layer 14 and an electron controlling layer 15 disposed between the cathode 16 and the quantum dot layer 13.

A substrate may be disposed at the side of the anode 11 or the cathode 16. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

The anode 11 may be made of a conductor having high work function, and may be for example made of a metal, a conductive metal oxide, or a combination thereof. The anode 11 may be for example made of a metal or an alloy thereof such as nickel, platinum, vanadium, chromium, copper, zinc, gold, or a combination thereof; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto.

The cathode 16 may be for example made of a conductor having a work function that is less than a work function of the anode 11, and may be for example made of a metal, a conductive metal oxide, a conductive polymer, or a combination thereof. The cathode 16 may be for example a metal or an alloy thereof such as for example aluminum, magnesium, calcium, sodium, potassium, titanium, indium, yttrium, lithium, gadolinium silver, tin, lead, cesium, barium, or a combination thereof; or a multi-layer structure material such as LiF/Al, $LiO_2$/Al, Liq/Al, LiF/Ca, and $BaF_2$/Ca, but is not limited thereto.

A work function of the anode 11 may be higher than that of the cathode 16. For example, the work function of the anode 11 may be for example about 4.5 eV to about 5.0 eV and the work function of the cathode 16 may be for example greater than or equal to about 4.0 eV and less than about 4.5 eV. Within the ranges, the work function of the anode 11 may be for example about 4.6 eV to about 4.9 eV and the work function of the cathode 16 may be for example about 4.0 eV to about 4.3 eV.

The anode 11, the cathode 16, or a combination thereof may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the anode 11 and the cathode 16 is a non-light-transmitting electrode, the non-light-transmitting electrode may be made of for example an opaque conductor such as aluminum (Al), silver (Ag), or gold (Au).

The quantum dot layer 13 includes a quantum dot. The quantum dot may be a semiconductor nanocrystal, and may have various shapes, for example a spherical semiconductor nanocrystal, a quantum rod, and a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, of less than or equal to about 30:1, or of less than or equal to about 20:1.

The quantum dot may have for example a particle diameter (a length of the largest portion for a non-spherical shape) of for example about 1 nm to about 100 nm, about 1 nm to about 80 nm, about 1 nm to about 50 nm, or about 1 nm to about 20 nm.

An energy bandgap of quantum dot may be controlled according to a size and a composition of the quantum dot, and thus photoluminescence wavelength may be controlled. For example, as the size of a quantum dot increases, the quantum dot may have relatively narrow energy bandgaps and emit light in a relatively long wavelength region while as the size of the quantum dot decreases, the quantum dot may have relatively wide energy bandgap and emit light in a relatively short wavelength region.

For example, the quantum dot may emit for example light in a predetermined wavelength region of a visible light region according to the size of the quantum dot, the composition of the quantum dot, or a combination thereof. For example, the quantum dot may emit blue light, red light, or green light, and the blue light may have for example a peak emission wavelength in a wavelength region of about 430 nm to about 470 nm, the red light may have for example a peak emission wavelength in a wavelength region of about 600 nm to about 650 nm, and the green light may have for example a peak emission wavelength in a wavelength region of about 520 nm to about 550 nm. For example, the quantum dot may emit blue light having a peak emission wavelength in a wavelength region of about 430 nm to about 470 nm.

For example, an average size of the blue light emitting quantum dot may be for example less than or equal to about 4.5 nm, less than or equal to about 4.3 nm, less than or equal to about 4.2 nm, less than or equal to about 4.1 nm, or less than or equal to 4.0 nm. Within the ranges, the average size of the blue light emitting quantum dot may be for example about 2.0 nm to about 4.5 nm, about 2.0 nm to about 4.3 nm, about 2.0 nm to about 4.2 nm, about 2.0 nm to about 4.1 nm, or about 2.0 nm to about 4.0 nm. As used herein, in the case of a single quantum dot, the phrase "average size" refers to the size of the quantum dot.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM). Herein, the FWHM is a width of a wavelength corresponding to a half of a peak absorption point and as the FWHM is narrower, light in a narrower wavelength region may be emitted and high color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may be for example a Group II-VI semiconductor compound, a Group III-V semiconductor compound, a Group IV-VI semiconductor compound, a Group IV semiconductor element or compound, a Group semiconductor compound, a Group I-II-IV-VI semiconductor compound, a Group II-III-V semiconductor compound, or a combination thereof. The Group II-VI semiconductor compound may be for example a binary element of CdSe, CdTe, ZnS, ZnSe, ZnTe, ZnO, HgS, HgSe, HgTe, MgSe, MgS, or a combination thereof; a ternary element of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element of GaN, GaP, GaAs, GaSb, AlN, AlP, AlAs, AlSb, InN, InP, InAs, InSb, or a combination thereof; a ternary element of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element of SnS, SnSe, SnTe, PbS, PbSe, PbTe, or a combination thereof; a ternary element of SnSeS, SnSeTe, SnSTe, PbSeS, PbSeTe, PbSTe, SnPbS, SnPbSe, SnPbTe, or a combination thereof; a quaternary element of SnPbSSe, SnPbSeTe, SnPbSTe, or a combination thereof; or a combination thereof, but is not limited thereto. The Group IV semiconductor element or compound may be for example a singular element semiconductor of Si, Ge, or a combination thereof; a binary element semiconductor of SiC, SiGe, or a combination thereof; or a combination thereof, but is not limited thereto. The Group semiconductor compound may be for example selected from $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a non-cadmium-based quantum dot. Cadmium (Cd) may cause severe environment/health problems and is a restricted element by Restriction of Hazardous Substances Directive (RoHS) in a plurality of countries, and thus the non-cadmium-based quantum dot may be effectively used.

For example, the quantum dot may be a semiconductor compound including zinc (Zn) and tellurium (Te), selenium (Se), or a combination thereof. For example, the quantum dot may be a Zn—Te semiconductor compound, a Zn—Se semiconductor compound, a Zn—Te—Se semiconductor compound, or a combination thereof. For example, in the Zn—Te—Se semiconductor compound, an amount of tellurium (Te) may be smaller than that of selenium (Se). The semiconductor compound may have a peak emission wavelength in a wavelength region of less than or equal to about 470 nm, for example in a wavelength region of about 430 nm to about 470 nm and may emit blue light.

For example, the quantum dot may be for example a semiconductor compound including indium (In) and zinc (Zn), phosphorus (P), or a combination thereof. For example, the quantum dot may be an In—Zn semiconductor compound, an In—P semiconductor compound, an In—Zn—P semiconductor compound, or a combination thereof. For example, in the In—Zn semiconductor compound or the In—Zn—P semiconductor compound, a molar ratio of zinc (Zn) relative to indium (In) may be greater than or equal to about 25:1. The semiconductor compound may have a peak emission wavelength in a wavelength region of less than or equal to about 470 nm, for example in a wavelength region of about 430 nm to about 470 nm and may emit blue light.

The quantum dot may have a core-shell structure wherein one quantum dot surrounds another quantum dot. For example, the core and the shell of the quantum dot may have an interface, and an element of the core, an element of the shell, or a combination thereof in the interface may have a concentration gradient, for example, the concentration of the element(s) of the shell decreases toward the core. For example, a material composition of the shell of the quantum dot may have a higher energy bandgap than a material composition of the core of the quantum dot, and the quantum dot may exhibit a quantum confinement effect.

The quantum dot may have one quantum dot core and a multi-layered quantum dot shell surrounding the core. Herein, the multi-layered shell has at least two shells wherein each shell may include, e.g., be, a single composition, an alloy, a concentration gradient, or a combination thereof.

For example, a shell of a multi-layered shell that is far, e.g., relatively farther, from the core may have a higher energy bandgap than a shell that is near, e.g., relatively closer, to the core, and the quantum dot may exhibit a quantum confinement effect.

For example, the quantum dot having a core-shell structure may for example include a core including a first semiconductor compound including zinc (Zn) and tellurium (Te), selenium (Se), or a combination thereof and a shell disposed on at least one part of the core and including a second semiconductor compound having a different composition from that of the core.

For example, the first semiconductor compound may be a Zn-Te-Se-based semiconductor compound including zinc (Zn), tellurium (Te), and selenium (Se), for example a Zn-Se-based semiconductor compound including a small amount of tellurium (Te), for example, a semiconductor compound represented by $ZnTe_xSe_{1-x}$ (wherein, x is greater than about 0 and less than or equal to about 0.05).

For example, in the Zn-Te-Se-based first semiconductor compound, the mole amount of zinc (Zn) may be greater than that of selenium (Se), and the mole amount of selenium (Se) may be greater than that of tellurium (Te). For example, in the first semiconductor compound, a molar ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a molar ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

The second semiconductor compound may include for example a Group II-VI semiconductor compound, a Group III-V semiconductor compound, a Group IV-VI semiconductor compound, a Group IV semiconductor element or compound, a Group semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor element or compound, the Group I-III-VI semiconductor compound, the Group I-II-IV-VI semiconductor compound, and the Group II-III-V semiconductor compound are the same as described above.

For example, the second semiconductor compound may include zinc (Zn), and selenium (Se), sulfur (S), or a combination thereof. For example, the shell may include ZnSeS, ZnS, or a combination thereof. For example, the shell may include at least one internal shell disposed near, e.g., relatively closer, to the core and an outermost shell disposed at an outermost layer of the shell of the quantum dot and the internal shell may include ZnSeS and the outermost shell may include ZnS. For example, the shell may have a concentration gradient of one component and for example an amount of sulfur (S) may increase as being apart from the core.

For example, the quantum dot having a core-shell structure may include for example a core including a third semiconductor compound including indium (In) and zinc (Zn), phosphorus (P), or a combination thereof and a shell disposed on at least one part of the core and including a fourth semiconductor compound having a different composition from the core.

In the In-Zn-P-based third semiconductor compound, a molar ratio of zinc (Zn) relative to indium (In) may be greater than or equal to about 25:1. For example, in the In-Zn-P-based third semiconductor compound, the molar ratio of zinc (Zn) relative to indium (In) may be greater than or equal to about 28:1, greater than or equal to about 29:1, or greater than or equal to about 30:1. For example, in the In-Zn-P-based third semiconductor compound, the molar ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor element or compound, the Group I-III-VI semiconductor compound, the Group I-II-IV-VI semiconductor compound, and the Group II-III-V semiconductor compound are the same as described above.

For example, the fourth semiconductor compound may include zinc (Zn) and sulfur (S), and optionally selenium (Se). For example, the shell may include ZnSeS, ZnS, or a combination thereof. For example, the shell may include at least one internal shell disposed near, e.g., relatively closer, to the core and an outermost shell disposed at an outermost layer of the shell of the quantum dot and the internal shell, the outermost shell or a combination thereof may include the fourth semiconductor compound of ZnS or ZnSeS.

The quantum dot layer 13 may have for example a thickness of about 5 nm to about 200 nm, for example about 10 nm to about 150 nm, about 10 nm to about 100 nm, or about 10 nm to about 50 nm.

The quantum dot layer 13 may have a relatively high HOMO energy level and may be for example a HOMO energy level of greater than or equal to about 5.4 eV, greater than or equal to about 5.6 eV, greater than or equal to about 5.7 eV, greater than or equal to about 5.8 eV, greater than or equal to about 5.9 eV or greater than or equal to about 6.0 eV. The HOMO energy level of the quantum dot layer 13 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, within the ranges, for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, for example about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV, for example about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, for example about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The quantum dot layer 13 may have a relatively low LUMO energy level, and may have for example an LUMO energy level of less than or equal to about 3.6 eV, for example less than or equal to about 3.5 eV, less than or equal to about 3.4 eV, less than or equal to about 3.3 eV, less than or equal to about 3.2 eV, or less than or equal to about 3.0 eV. The LUMO energy level of the quantum dot layer 13 may be for example about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, or about 2.5 eV to about 3.0 eV.

The quantum dot layer 13 may have an energy bandgap of about 2.4 eV to about 2.9 eV. Within the ranges, the quantum dot layer 13 may have for example an energy bandgap of about 2.4 eV to about 2.8 eV, for example about 2.4 eV to about 2.78 eV.

The hole transport layer 12 is disposed between the anode 11 and the quantum dot layer 13. The hole transport layer 12 may have one layer or two or more layers and may increase a hole transporting property from the anode 11 to the quantum dot layer 13.

The hole transport layer 12 may have a relatively high HOMO energy level so that the HOMO energy level of the hole transport layer 12 may match a HOMO energy level of the quantum dot layer 13. Accordingly, a hole transporting property from the hole transport layer 12 into the quantum dot layer 13 may be increased.

The hole transport layer 12 may have the same HOMO energy level as the quantum dot layer 13 or may have a HOMO energy level that is within about 1.0 eV or less of the HOMO energy level of the quantum dot layer 13. For example, a difference between HOMO energy levels of the hole transport layer 12 and the quantum dot layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The hole transport layer 12 may have a HOMO energy level of for example greater than or equal to about 5.0 eV, greater than or equal to about 5.2 eV, greater than or equal to about 5.4 eV, greater than or equal to about 5.6 eV, or greater than or equal to about 5.8 eV.

For example, the hole transport layer 12 may have a HOMO energy level of about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole transport layer 12 may include any material satisfying the energy level without a particularly limit and may be for example poly(9,9-dioctyl-fluoren-2,7-diyl-co-(4, 4'-(N-(4-butylphenyl)-diphenylamine)) (TFB), polyarylamine, poly(N-vinylcarbazole, polyaniline, polypyrrole, N,N, N',N'-tetrakis(4-methoxyphenyl)-benzidine (TPD), (4,4'-bis [N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), p-type metal oxide (e.g., NiO, WO$_3$, MoO$_3$, etc.), a carbon-based material such as graphene oxide, or a combination thereof, but is not limited thereto.

A hole injection layer may be disposed between the anode 11 and the hole transport layer 12 as needed. The hole injection layer may facilitate hole injection from the anode 11. The hole injection layer may have a HOMO energy level of about 5.0 eV to about 6.0 eV, about 5.0 eV to about 5.5 eV, or about 5.0 eV to about 5.4 eV. The hole injection layer may include for example poly(3,4-ethylenedioxythiophene) (PEDOT) or poly(3,4-ethylenedioxythiophene) polystyrene sulfonate (PEDOT:PSS), but is not limited thereto.

The electron transport layer 14 is disposed between the cathode 16 and the quantum dot layer 13. The electron transport layer 14 may increase electron transporting property from the cathode 16 to the quantum dot layer 13. The electron transport layer 14 may be an inorganic electron transport layer made of an inorganic material or including the inorganic material as a main component. Herein, the main component may be included in an amount of greater than or equal to about 50 volume %, greater than or equal to about 60 volume %, greater than or equal to about 70 volume %, greater than or equal to about 80 volume %, greater than or equal to about 90 volume %, greater than or equal to about 95 volume %, greater than or equal to about 98 volume %, greater than or equal to about 99 volume %, or about 100 volume % in the electron transport layer 14.

The electron transport layer 14 may for example include a first inorganic material. The first inorganic material may include, e.g., be, inorganic nanoparticles. The inorganic nanoparticles may have an average particle diameter for example of less than or equal to about 10 nm and for example in a range of about 1 nm to about 10 nm, for example about 2 nm to about 10 nm, and for example about 3 nm to about 8 nm. As used herein, in the case of a single inorganic nanoparticle, the phrase "average particle diameter" refers to the particle diameter of the inorganic nanoparticle.

For example, the first inorganic material may include a zinc-containing oxide. The zinc-containing oxide may be an oxide including zinc as a main component and optionally, doped with another metal or semi-metal, for example, $Zn_{1-x}M_xO$ (wherein M is Mg, Co, Ni, Zr, Mn, Sn, Y, Al, or a combination thereof, $0 \leq x < 0.5$).

For example, M may be Mg, Co, Ni, or a combination thereof, and x may be in a range of about $0.01 \leq x \leq 0.4$, about $0.02 \leq x \leq 0.4$, about $0.03 \leq x \leq 0.3$, or about $0.05 \leq x \leq 0.3$.

For example, the first inorganic material may include ZnO nanoparticles $Zn_{1-x}Mg_xO$ nanoparticles, or a combination thereof.

A LUMO energy level of the electron transport layer 14 may be higher than that of the quantum dot layer 13, and may be for example, in a range of about 3.0 eV to about 5.3 eV, about 3.2 eV to about 5.3 eV, about 3.3 eV to about 5.3 eV, about 3.5 eV to about 5.3 eV, or about 3.7 eV to about 5.3 eV.

The electron transport layer 14 may have a thickness of about 5 nm to about 50 nm.

The electron controlling layer 15 may decrease electron transporting property from the cathode 16 to the quantum dot layer 13, on the contrary to, e.g., in contrast to, the electron transport layer 14. In the quantum dot device 10 in which an electron mobility is faster than a hole mobility, the electron controlling layer 15 may decrease the electron mobility from the cathode 16 to the quantum dot layer 13 and thus reduce imbalance between the number of electrons and the number of holes reaching the quantum dot layer 13. Accordingly, the balance between the number of electrons and the number of holes in the quantum dot layer 13 is increased, while extra electrons are decreased, and resultantly, efficiency and a life-span of the quantum dot device 10 may be improved.

For example, the electron controlling layer 15 may form an energy barrier along a LUMO energy level where electrons move, for example, the LUMO energy level of the electron controlling layer 15 may be respectively less than those of the quantum dot layer 13 and the electron transport layer 14. For example, the electron controlling layer 15 may have a LUMO energy level ranging from about 2.0 eV to about 3.0 eV.

For example, an energy bandgap (Eg) of the electron controlling layer 15 may be respectively larger than those of the quantum dot layer 13 and the electron transport layer 14. For example, the energy bandgap of the electron controlling layer 15 may be in a range of about 2.9 eV to about 5.5 eV.

For example, electron mobility of the electron controlling layer 15 may be less than that of the electron transport layer 14, for example, the electron mobility of the electron controlling layer 15 may be about 0.2 times to 0.9 times, about 0.3 times to about 0.8 times, or about 0.4 times to about 0.7 times the electron mobility of the electron transport layer 14.

The electron controlling layer 15 may be disposed at one surface or both surfaces of the electron transport layer 14 between the cathode 16 and the quantum dot layer 13. In other words, the electron controlling layer 15 may be disposed between the cathode 16 and the electron transport layer 14, between the quantum dot layer 13 and the electron transport layer 14, or a combination thereof.

For example, as shown in FIG. 1, the electron controlling layer 15 may be disposed between the cathode 16 and the electron transport layer 14.

For example, as shown in FIG. 2, the electron controlling layer 15 may be disposed between the quantum dot layer 13 and the electron transport layer 14.

For example, as shown in FIG. 3, the electron controlling layer 15 may be disposed between the cathode 16 and the electron transport layer 14 and between the quantum dot layer 13 and the electron transport layer 14.

The electron controlling layer 15 may be an inorganic electron controlling layer made of an inorganic material or including the inorganic material as a main component. Herein, the main component may be included in an amount of greater than or equal to about 50 volume %, greater than or equal to about 60 volume %, greater than or equal to about 70 volume %, greater than or equal to about 80 volume %, greater than or equal to about 90 volume %, greater than or equal to about 95 volume %, greater than or equal to about 98 volume %, greater than or equal to about 99 volume %, or about 100 volume % in the electron controlling layer 15.

The electron controlling layer 15 may include for example a second inorganic material which differs from the above first inorganic material. The second inorganic material may include, e.g., be, inorganic nanoparticles. The inorganic nanoparticles may have an average particle diameter for example of less than or equal to about 10 nm, about 1 nm to about 10 nm, about 2 nm to about 10 nm, or about 3 nm to about 8 nm. As used herein, in the case of a single inorganic nanoparticle, the phrase "average particle diameter" refers to the particle diameter of the inorganic nanoparticle.

For example, the second inorganic material may be an oxide; a nitride; a sulfide; a phosphide; a halide; or a combination thereof, including a metal, a semi-metal, or a combination thereof. For example, the second inorganic material may be an oxide, a nitride, a sulfide, a phosphide, a halide, or a combination thereof including gallium (Ga), nickel (Ni), copper (Cu), tungsten (W), manganese (Mn), chromium (Cr), tantalum (Ta), bismuth (Bi), indium (In), aluminum (Al), lead (Pb) zirconium (Zr), or a combination thereof. For example, the second inorganic material may be an oxide, a nitride, a sulfide, a phosphide, a halide, or a combination thereof, having a crystal structure, for example, a perovskite oxide. For example, the second inorganic material may include an oxide such as for example a gallium oxide, a zirconium oxide, a manganese oxide, a chromium oxide, a potassium tantalum oxide, a bismuth oxide, an indium oxide, an aluminum oxide, or a combination thereof; a nitride such as an aluminum nitride; a sulfide such as a manganese sulfide; a phosphide such as a gallium phosphide; a halide such as a lead bromide, a lead iodide, or a combination thereof; or a combination thereof. For example, the second inorganic material may include $Ga_2O_3$, $ZrO_2$, MnO, $Cr_2O_3$, $KTaO_3$, $Bi_2O_3$, $In_2O_3$, $Al_2O_3$, AlN, MnS, GaP, $MAPbBr_3$ (methylammonium lead (II) bromide), $EAPbI_3$ (ethylammonium lead (II) iodide), or a combination thereof. For example, the second inorganic material may include a gallium oxide, for example, a gamma-gallium oxide, i.e., $\gamma$-$Ga_2O_3$. For example, the second inorganic material may be for example $\gamma$-$Ga_2O_3$ nanoparticles, and the $\gamma$-$Ga_2O_3$ nanoparticles may have a cubic crystal structure.

A thickness of the electron controlling layer 15 may be thinner than that of the electron transport layer 14, and may be for example, about 0.2 times to about 0.8 times, or about 0.3 times to about 0.7 times a thickness of the electron transport layer 14. For example, the thickness of the electron controlling layer 15 may be in a range of about 1 nm to about 10 nm.

Optionally, an additional layer, for example, an electron injection layer (EIL) may be further included between the cathode 16 and the quantum dot layer 13. The electron injection layer (EIL) may facilitate an electron injection from the cathode 16.

For example, a method of manufacturing the quantum dot device 10 may include forming the anode 11 on a substrate, forming the hole transport layer 12 on the anode 11, forming the quantum dot layer 13 on the hole transport layer 12, forming the electron transport layer 14 and the electron controlling layer 15 on the quantum dot layer 13, and forming the cathode 16 on the electron transport layer 14 and the electron controlling layer 15, wherein the forming of the electron controlling layer 15 may be performed before the forming of the electron transport layer 14, after the forming of the electron transport layer 14, or a combination thereof. Herein, the hole transport layer 12, the quantum dot layer 13, the electron transport layer 14, and the electron controlling layer 15 may be for example formed with a solution process, respectively, for example, spin coating, slit coating, inkjet printing, a nozzle printing, spraying, a doctor blade coating, or a combination thereof, but is not limited thereto.

For example, the forming of the electron transport layer 14 may include preparing a dispersion for an inorganic electron transport layer including an inorganic nanoparticle represented by $Zn_{1-x}M_xO$ ($0 \le x < 0.5$) using a solution including a Zn precursor and optionally an M precursor (wherein M is Mg, Co, Ni, Zr, Mn, Sn, Y, Al, or a combination thereof) through a sol-gel reaction and coating the dispersion for an inorganic electron transport layer. Herein, the solution may include, for example an alcohol solvent, for example methanol, ethanol, isopropanol, butanol, or a mixed solvent thereof.

For example, the forming of the electron controlling layer 15 may include heat-treating a solution including a Ga precursor to prepare a dispersion for an inorganic electron controlling layer including an inorganic nanoparticle represented by $\gamma$-$Ga_2O_3$, and coating the dispersion for the inorganic electron controlling layer. Herein, the solution may include, for example an amine solvent, for example an alkylamine solvent, for example oleylamine but is not limited thereto. The heat-treating may be for example performed at about 70° C. to about 500° C., for example about 80° C. to about 450° C., for example about 100° C. to about 400° C.

The quantum dot device may be for example applied to various electronic devices such as for example display devices or lighting devices.

Hereinafter, the embodiments are illustrated in more detail with reference to examples. However, these examples are exemplary, and the present disclosure is not limited thereto.

SYNTHESIS EXAMPLE

Synthesis of Quantum Dot (1) Synthesis of ZnTeSe Core

Selenium (Se) and tellurium (Te) are dispersed in trioctylphosphine (TOP) respectively to obtain a 2 molar (M) Se/TOP stock solution and a 0.1 M Te/TOP stock solution.

0.125 millimoles (mmol) of zinc acetate, 0.25 mmol of oleic acid, and 0.25 mmol of hexadecylamine are put along with 10 milliliters (mL) of trioctylamine in a reactor and then, heated at 120° C. under vacuum. After 1 hour, an atmosphere in the reactor is substituted with nitrogen.

After heating the reactor at 240° C., the Se/TOP stock solution and the Te/TOP stock solution are rapidly added thereto in a Te/Se molar ratio of 1:25. After increasing the temperature to 300° C. and then maintaining the reaction solution for 30 minutes, the reaction solution is rapidly cooled down to room temperature, acetone is added thereto, and a precipitate obtained by centrifuging the mixture is dispersed in toluene to obtain a toluene dispersion of a ZnTeSe core quantum dot.

(2) Synthesis of ZnTeSe Core/ZnSeS Shell Quantum Dot

Trioctylamine is put in a 10 mL flask. 0.6 mmol of zinc acetate and 1.2 mmol of oleic acid are added thereto and then, treated under vacuum at 120° C. for 10 minutes. Subsequently, after substituting inside atmosphere of the flask with nitrogen ($N_2$), the toluene dispersion of the ZnTeSe core obtained in Step (1) is rapidly injected therein and then, heated up to 340° C. and reacted, while Se/TOP stock solution and 1 molar (M) STOP stock solution prepared by dispersing sulfur in trioctylphosphine are added thereto in a Se/S molar ratio of 1.2:2.8. When the reaction is complete, the reactor is cooled down, and the prepared nanocrystals are centrifuged with ethanol and dispersed in toluene to obtain a toluene dispersion of ZnTeSe/ZnSeS core/shell quantum dots.

PREPARATION EXAMPLE 1

Preparation of Dispersion for Electron Transport Layer 8.07 mmol of zinc acetate dihydrate, 0.93 mmol of magnesium acetate tetrahydrate, and 90 mL of dimethylsulfoxide are put into a reactor and heated under air at 60° C. Subsequently, 15 mmol of tetramethylammonium hydroxide pentahydrate is dissolved in 30 mL of ethanol and the solution is added into the reactor at a rate of 3 mL per one minute in a dropwise fashion. After stirring the mixture for 1 hour, the prepared $Zn_{0.85}Mg_{0.15}O$ nanoparticles and ethyl acetate are centrifuged in a volume ratio of 1:9 and dispersed in ethanol to obtain a solution in which the $Zn_{0.85}Mg_{0.15}O$ nanoparticles having an average particle diameter of about 3.5 nm (measured by FEI Titan™ G2 80-200 TEM operated at 200 kV) are dispersed.

PREPARATION EXAMPLE 2

Preparation of Dispersion for Electron Controlling Layer 0.5 grams (g) of gallium acetylacetonate ($Ga(acac)_3$) and 7 g of oleylamine as a solvent are put in a 100 ml flask, and the mixture is heated up to 80° C. When the gallium acetylacetonate is completely dissolved, the solution is deaerated and heated at an average rate of 3° C./minute up to 310° C., while continuously stirred under an argon atmosphere. Subsequently, after decreasing the temperature down to 150° C., tri-n-octylphosphine oxide (TOPO) is injected thereinto, and the obtained mixture is stirred for 30 minutes. When a reaction is complete, the reactor is cooled down, and the prepared nanocrystal is centrifuged with ethanol and then, dispersed in hexane or toluene to obtain dispersion in which γ-$Ga_2O_3$ nanoparticles having a particle diameter distribution of about 4 nanometers (nm) to 7 nm (measured by FEI Titan™ G2 80-200 TEM operated at 200 kV) are dispersed.

Evaluation I

The dispersion for an electron controlling layer according to Preparation Example 2 is spin-coated to be 10 nm thick and heat-treated at 80° C. for 30 minutes to form a thin film.

Figure 4:
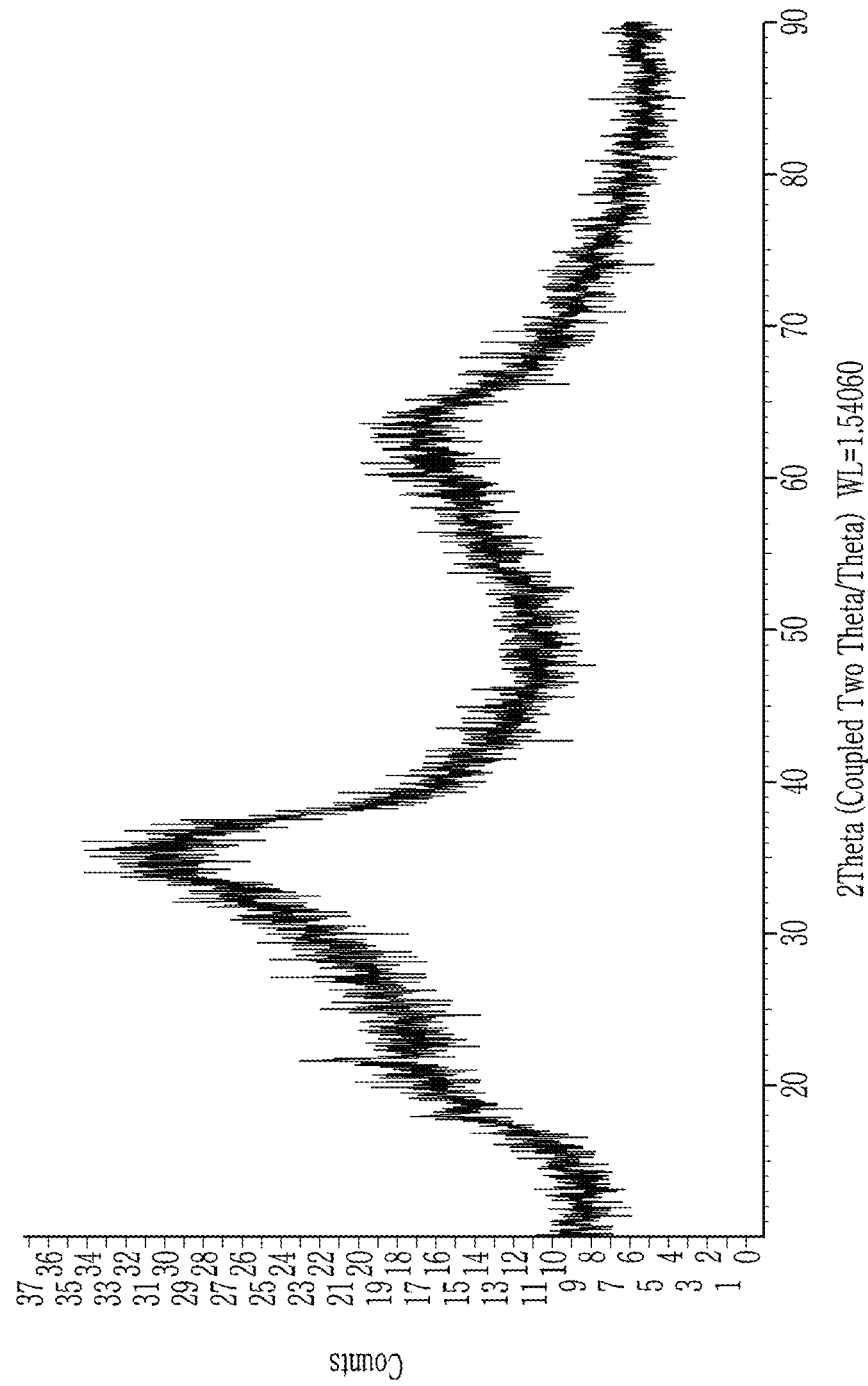
FIG. 4 is a graph of counts versus 2Theta (coupled two theta/theta) showing an X-ray diffraction (XRD) pattern of the thin film obtained from the dispersion for an electron controlling layer obtained in Preparation Example 2.
Figure 5:
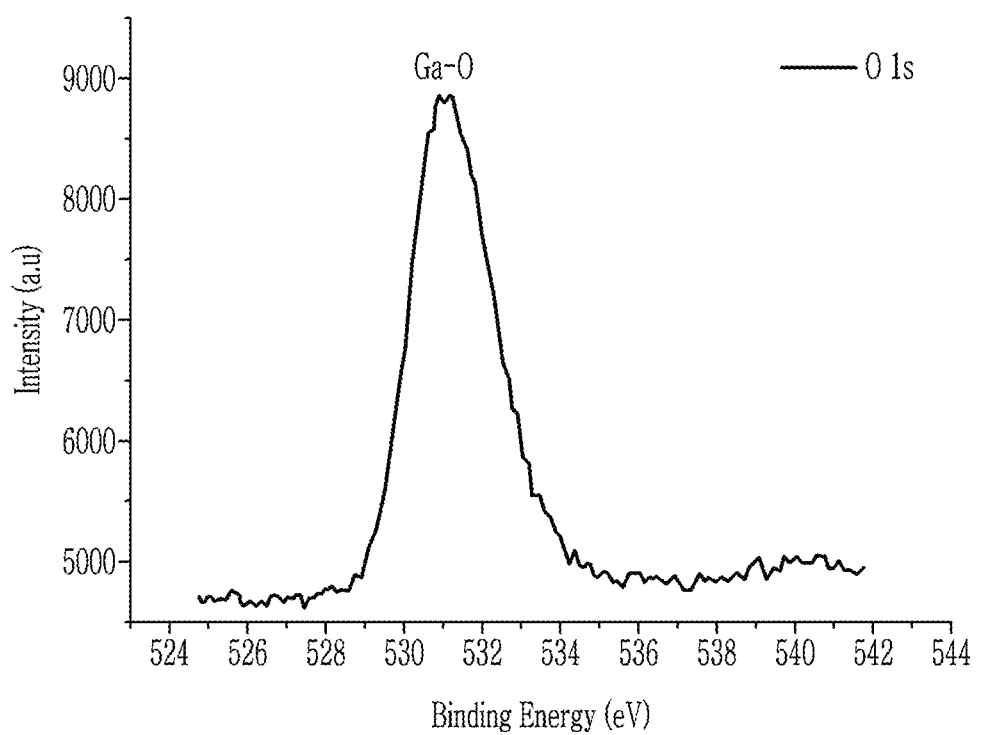
FIGS. 5 and 6 are graphs of intensity (arbitrary units (a.u.)) versus binding energy (electronvolts (eV)) showing an X-ray photoelectron spectroscopy (XPS) analysis result of the thin film obtained from the dispersion for an electron controlling layer obtained in Preparation Example 2, respectively.
Figure 6:
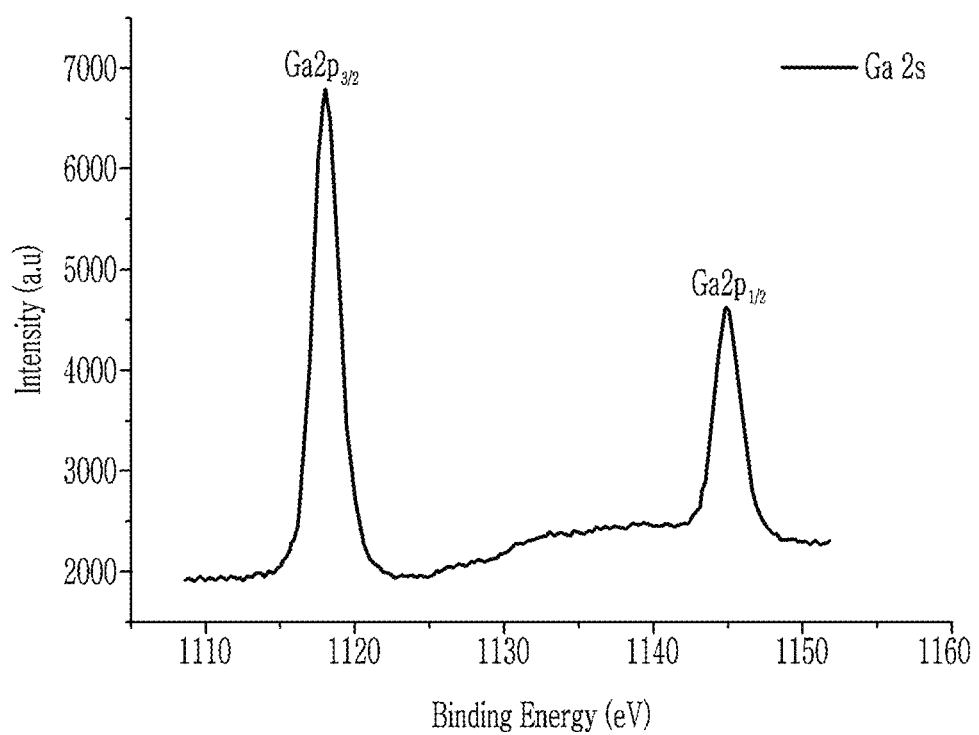
Figure 7:
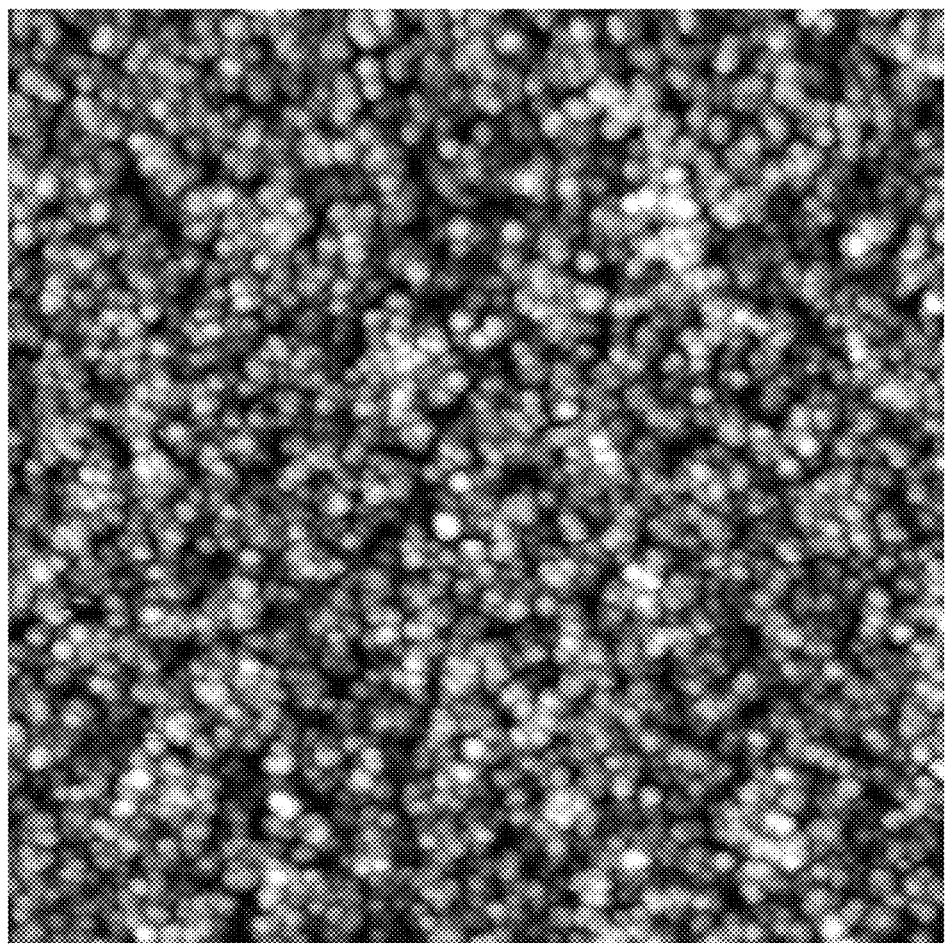
FIG. 7 is an atomic force microscope (AFM) photograph showing a morphology of the thin film obtained from the dispersion for an electron controlling layer obtained in Preparation Example 2.

FIG. 4 is a graph showing an X-ray diffraction (XRD) pattern of the thin film obtained from the dispersion for an electron controlling layer obtained in Preparation Example 2, FIGS. 5 and 6 are graphs showing an X-ray photoelectron spectroscopy (XPS) analysis result of the thin film obtained from the dispersion for an electron controlling layer obtained in Preparation Example 2, respectively, and FIG. 7 is an atomic force microscope (AFM) photograph showing a morphology of the thin film obtained from the dispersion for an electron controlling layer obtained in Preparation Example 2.

Referring to FIGS. 4 to 7, the thin film obtained from the dispersion for an electron controlling layer obtained in Preparation Example 2 shows that the γ-$Ga_2O_3$ nanoparticles having a cubic crystal structure are relatively uniformly distributed. The γ-$Ga_2O_3$ nanoparticles have a particle diameter distribution ranging from about 4 nm to 7 nm, an exciton peak of 302 nm, an energy bandgap of 3.08 electronvolts (eV), a peak emission wavelength of 425 nm, and an average roughness (Rq) of 2.52 nm.

Manufacture of Quantum Dot Device

EXAMPLE 1

A glass substrate deposited with ITO (work function (WF): 4.8 eV) that is an anode is surface-treated with an ultraviolet (UV)-ozone for 15 minutes, spin-coated with a poly(3,4-ethylenedioxythiophene) polystyrene sulfonate (PEDOT:PSS) solution (H.C. Starks Co., Ltd.), and heat-treated under the air atmosphere at 150° C. for 10 minutes and then, under an $N_2$ atmosphere at 150° C. for 10 minutes to form a 30 nm-thick hole injection layer (highest occupied molecular orbital (HOMO) energy level: 5.3 eV and lowest unoccupied molecular orbital (LUMO) energy level: 2.7 eV). Subsequently, on the hole injection layer, a 25 nm-thick hole transport layer (HOMO: 5.6 eV and LUMO: 2.69 eV) is formed by spin-coating poly[(9,9-dioctylfluoren-2,7-diyl)-co-(4,4'-(N-4-butylphenyl))diphenylamine] solution (TFB) (Sumitomo) and heat-treating the same at 150° C. for 30 minutes. On the hole transport layer, a 20 nm-thick quantum dot layer (HOMO energy level: 5.7 eV and LUMO energy level: 2.97 eV) is formed by spin-coating the ZnTeSe/ZnSeS core-shell quantum dot obtained in Synthesis Example and heat-treating the same at 80° C. for 30 minutes. On the quantum dot layer, a 10 nm-thick electron controlling layer is formed by spin-coating the dispersion for the electron controlling layer obtained in Preparation Example 2 and heat-treating the same at 80° C. for 30 minutes. On the electron controlling layer, a 20 nm-thick electron transport layer (HOMO energy level: 8.0 eV and LUMO energy level: 4.3 eV) is formed by spin-coating the dispersion for the electron transport layer obtained in Preparation Example 1 and heat-treating the same at 80° C. for 30 minutes. On the electron transport layer, a cathode is formed by depositing aluminum (Al) to be 100 nm thick under vacuum to manufacture a quantum dot device.

COMPARATIVE EXAMPLE 1

A quantum dot device is prepared according to the same method as Example 1 except that the electron controlling layer is not formed.

Evaluation II

Current-voltage-luminescence characteristics of the quantum dot devices according to Example 1 and Comparative Example 1 are evaluated.

The current-voltage-luminescence characteristics are evaluated by using a Keithley 220 current source meter and a Minolta CS200 spectroradiometer.

The results are shown in Table 1.

TABLE 1

|  | Example 1 | Comparative Example 1 |
|---|---|---|
| $EQE_{max}$ (%) | 15.5 | 11.7 |
| EQE @ 500 nit (%) | 15.1 | 8.3 |
| Maximum current efficiency (candelas per ampere (cd/A)) | 7.8 | 5.4 |
| Luminance (candelas per square meter (cd/m$^2$)) @ 5 milliamperes (mA) | 387 | 159 |
| T60 @ 325 nit (hours) | 5.7 | 3.6 |
| $\lambda_{max}$ (nm) | 452 | 452 |
| Full width at half maximum (nm) | 19 | 21 |

* $EQE_{max}$: maximum external quantum efficiency
* EQE @ 500 nit: external quantum efficiency at 500 nit (candelas per square meter)
* Luminance (Cd/m$^2$) @ 5 mA: Luminance at 5 mA
* T60 @ 325 nit: time taken for luminance at a constant current of an initial 325 nit reference to decrease to 60%
* $\lambda_{max}$: peak emission wavelength Referring to Table 1, the quantum dot device according to Example 1 shows improved efficiency and life-span compared with the quantum dot device according to Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device, comprising
an anode and a cathode facing each other,
a quantum dot layer between the anode and the cathode,
a hole transport layer between the anode and the quantum dot layer, the hole transport layer being configured to increase a hole transporting property from the anode to the quantum dot layer,
an inorganic electron transport layer between the cathode and the quantum dot layer, the inorganic electron transport layer being configured to increase an electron transporting property from the cathode to the quantum dot layer, and
an inorganic electron controlling layer between the cathode and the quantum dot layer, the inorganic electron controlling layer being configured to decrease an electron transporting property from the cathode to the quantum dot layer,
wherein
the inorganic electron transport layer comprises a first inorganic material,
the inorganic electron controlling layer comprises a second inorganic material that is different from the first inorganic material, and
each of the first inorganic material and the second inorganic material comprises a nanoparticle having an average particle diameter of less than or equal to about 10 nanometers.

2. The quantum dot device of claim 1, wherein the inorganic electron controlling layer is disposed between the cathode and the inorganic electron transport layer, between the quantum dot layer and the inorganic electron transport layer, or a combination thereof.

3. The quantum dot device of claim 1, wherein the first inorganic material comprises a zinc-containing oxide.

4. The quantum dot device of claim 3, wherein the zinc-containing oxide is represented by $Zn_{1-x}M_xO$, wherein M is Mg, Co, Ni, Zr, Mn, Sn, Y, Al, or a combination thereof and $0 \leq x < 0.5$.

5. The quantum dot device of claim 1, wherein the second inorganic material comprises an oxide, a nitride, a sulfide, a phosphide, or a halide comprising gallium, nickel, copper, tungsten, manganese, chromium, tantalum, bismuth, indium, aluminum, lead, zirconium, or a combination thereof.

6. The quantum dot device of claim 5, wherein the second inorganic material comprises $\gamma\text{-}Ga_2O_3$.

7. The quantum dot device of claim 1, wherein
the first inorganic material comprises a zinc-containing oxide represented by $Zn_{1-x}M_xO$, wherein M is Mg, Co, Ni, Zr, Mn, Sn, Y, Al, or a combination thereof, $0 \leq x < 0.5$, and
the second inorganic material comprises gallium oxide.

8. The quantum dot device of claim 1, wherein a lowest unoccupied molecular orbital energy level of the inorganic electron controlling layer is less than
a lowest unoccupied molecular orbital energy level of the quantum dot layer and
a lowest unoccupied molecular orbital energy level of the inorganic electron transport layer.

9. The quantum dot device of claim 1, wherein an energy bandgap of the inorganic electron controlling layer is larger than
an energy bandgap of the quantum dot layer and
an energy bandgap of the inorganic electron transport layer.

10. The quantum dot device of claim 1, wherein a thickness of the inorganic electron controlling layer is less than a thickness of the inorganic electron transport layer.

11. The quantum dot device of claim 1, wherein a thickness of the inorganic electron controlling layer is about 1 nanometer to about 10 nanometers.

12. The quantum dot device of claim 1, wherein the quantum dot layer comprises a non-cadmium quantum dot.

13. The quantum dot device of claim 12, wherein the non-cadmium quantum dot comprises
zinc and
tellurium, selenium, or a combination thereof,
or
indium and
zinc, phosphorus, or a combination thereof.

14. The quantum dot device of claim 13, wherein the quantum dot comprises
a core comprising
zinc and
tellurium, selenium, or a combination thereof,
or
indium and
zinc, phosphorus, or a combination thereof, and
a shell on at least one part of the core, the shell comprising a different composition from the core.

15. The quantum dot device of claim 14, wherein the shell comprises ZnSeS, ZnS, or a combination thereof.

16. A method of manufacturing a quantum dot device, comprising
forming an anode,
forming a hole transport layer on the anode,
forming a quantum dot layer on the hole transport layer,
forming an inorganic electron transport layer on the quantum dot layer,
forming an inorganic electron controlling layer on the quantum dot layer, and
forming a cathode on the inorganic electron controlling layer,
wherein the forming of the inorganic electron controlling layer is performed before forming of the inorganic electron transport layer, after the forming of the inorganic electron transport layer, or a combination thereof, and
the forming of the quantum dot layer, the forming of the inorganic electron transport layer, and the forming of the inorganic electron controlling layer are each performed using a solution process,
the forming of the inorganic electron transport layer comprises
preparing a dispersion for the inorganic electron transport layer comprising a first inorganic material, and
coating the dispersion for the inorganic electron transport layer, and
the forming of the inorganic electron controlling layer comprises
preparing a dispersion for the inorganic electron controlling layer comprising a second inorganic material that is different from the first inorganic material, and
coating the dispersion for the inorganic electron controlling layer,
each of the first inorganic material and the second inorganic material comprises a nanoparticle having an average particle diameter of less than or equal to about 10 nanometers.

17. The method of claim 16, wherein
the first inorganic material comprises the nanoparticle represented by $Zn_{1-x}M_xO$, wherein $0 \leq x < 0.5$, the first inorganic material being obtained by a sol-gel reaction of a solution comprising a Zn precursor and optionally an M precursor, wherein M is Mg, Co, Ni, Zr, Mn, Sn, Y, Al, or a combination thereof, and
the second inorganic material comprises the nanoparticle represented by $\gamma\text{-}Ga_2O_3$, the second inorganic material being obtained by heat-treating a solution comprising a Ga precursor.

18. A display device comprising the quantum dot device of claim 1.

19. A quantum dot device, comprising
an anode and a cathode facing each other,
a quantum dot layer between the anode and the cathode,
a hole transport layer between the anode and the quantum dot layer, the hole transport layer being configured to increase a hole transporting property from the anode to the quantum dot layer,
an inorganic electron transport layer between the cathode and the quantum dot layer, the inorganic electron transport layer being configured to increase an electron transporting property from the cathode to the quantum dot layer, and
an inorganic electron controlling layer between the cathode and the quantum dot layer, the inorganic electron controlling layer being configured to decrease an electron transporting property from the cathode to the quantum dot layer,
wherein
the inorganic electron transport layer comprises a first inorganic material, and
the inorganic electron controlling layer comprises a second inorganic material that is different from the first inorganic material,
wherein the second inorganic material comprises $\gamma\text{-}Ga_2O_3$.

20. A display device comprising the quantum dot device of claim 19.

* * * * *